United States Patent [19]

Robinson et al.

[11] Patent Number: 6,125,077

[45] Date of Patent: *Sep. 26, 2000

[54] APPARATUS AND METHOD FOR PROVIDING A QUIET TIME BEFORE ANALOG SIGNAL SAMPLING IN A MIXED SIGNAL INTEGRATED CIRCUIT EMPLOYING SYNCHRONOUS AND ASYNCHRONOUS CLOCKING

[75] Inventors: Moises E. Robinson; Tim J. Dupuis, both of Austin, Tex.

[73] Assignee: Oak Technology, Inc., Sunnyvale, Calif.

[*] Notice: This patent is subject to a terminal disclaimer.

[21] Appl. No.: 09/294,576

[22] Filed: Apr. 20, 1999

[51] Int. Cl.$^7$ ........................................................ G11C 8/00
[52] U.S. Cl. .............................................................. 365/233
[58] Field of Search ................................... 365/233, 194, 365/236; 340/347; 341/122; 327/163

[56] References Cited

U.S. PATENT DOCUMENTS

| | | | |
|---|---|---|---|
| 4,746,899 | 5/1988 | Swanson et al. | 340/347 |
| 4,849,935 | 7/1989 | Miyazawa | 365/189.05 |
| 5,654,657 | 8/1997 | Pearce | 327/163 |
| 5,706,004 | 1/1998 | Yeung | 327/163 |
| 5,943,290 | 8/1999 | Robinson et al. | 365/233 |

*Primary Examiner*—David Nelms
*Assistant Examiner*—David Lam
*Attorney, Agent, or Firm*—Kevin L. Daffer; Conley, Rose & Tayon

[57] ABSTRACT

A mixed signal integrated circuit is provided having analog and digital circuits coupled to receive respective analog and digital clocking signals. The analog circuit portion may involve switched capacitors which charge and discharge based on timing of the analog clocking signal. The critical sampling moments mandated by the analog clocking signal are purposefully delayed after a quiet time so that preexisting, digitally induced noise does not impute error in the sampled or loaded voltages. A clocking generator is therefore presented which delays rising edges of the digital clocking signal from falling edges of the analog clocking signal. The amount of delay is chosen to ensure that asynchronously generated noise arising from the digital clocking signal does not substantially affect the critical sampled or loaded voltages. The digital circuit portion can therefore include a memory element having transitory bit lines and a sense amplifier coupled to receive voltages on those bit lines. The effect of noise introduced by the transitory bit lines and the operable sense amplifiers is minimized by designing the digital clocking signal leading edge to be delayed a fraction of $1/(2(N/M))$ cycle of the digital clocking signal from a falling edge of the analog clocking signal. In this fashion, the settling time prior to sampling is a partial cycle of the digital clocking signal.

22 Claims, 4 Drawing Sheets

APPARATUS AND METHOD FOR PROVIDING A QUIET TIME BEFORE ANALOG SIGNAL SAMPLING IN A MIXED SIGNAL INTEGRATED CIRCUIT EMPLOYING SYNCHRONOUS AND ASYNCHRONOUS CLOCKING

BACKGROUND OF THE INVENTION

1. Field of the Invention

This invention relates to a mixed signal integrated circuit and, more particularly, to an apparatus and method for reducing noise imputed from a digital portion to an analog portion of the integrated circuit during the latter stages of when the analog portion is sampling an analog signal or dumping the sampled analog signal onto a node within, for example, an analog-to-digital ("A/D") converter or digital-to-analog ("D/A") converter.

2. Description of the Related Art

Mixed signal integrated circuits are generally well known as those which employ both analog and digital portions on a single monolithic substrate. A typical mixed signal integrated circuit may include an A/D converter, a D/A converter, and a digital signal processor ("DSP").

The DSP is preferably arranged between the A/D converter and the D/A converter, where it is well suited to manipulate digitally acquired binary numbers in rapid succession. The ease by which digitally represented numbers can be manipulated adds value to reasons why it is desirable to convert an analog signal to a digital signal via the A/D converter, and why it may be necessary to re-convert the digitally manipulated data back to an analog signal via the D/A converter. The DSP can quickly perform operations such as multiplication, summing, and delay as fast as the digital signal can be presented from the A/D converter. Digital operations can, in some instances, be performed faster than analog-type operations, the result of which are digital signals which can be more easily transmitted through a transmission medium than their counterpart analog signals.

The A/D converter serves primarily to acquire and periodically record an incoming analog signal, whereas the D/A converter reconstructs an analog signal from a sequence of quantifiable digital signals. The A/D and D/A converters may include a modulator portion which samples the corresponding input signal at a periodic time slice. A popular modulator includes the well known oversampling modulator, or delta-sigma modulator.

A delta-sigma modulator generally includes a front-end integrator and a back-end quantizer. The integrator includes capacitors which temporarily charge and discharge at the periodic time slice intervals based on whether certain switches are opened or closed. Controlling those switches therefore determines when sampling is performed and/or when the sampled incoming signal is placed upon the integrator. An analog clocking signal is used to control those switches.

Dissimilar from the analog clocking signal is a digital clocking signal. Specifically, the digital clocking signal is used to synchronize transitions between binary logic states of a digital signal within, for example, the DSP. Thus, the speed of the digital clocking signal will dictate the speed at which certain DSP operations can be performed. Unlike the analog clocking signal which is used exclusively by the analog portion (e.g., the front-end integrator), for example, the digital clocking signal is used exclusively by the digital portion to synchronize transitions within sequential logic and operations occurring by the DSP execution unit.

FIG. 1 illustrates an example of a mixed signal integrated circuit 10. Circuit 10 encompasses a single monolithic substrate which can be made from single crystal silicon or gallium arsenide. Arranged upon the monolithic substrate are various active and passive devices. The active and passive devices can be grouped either within an analog portion 12 or a digital portion 14. Analog portion 12 includes an arrangement of devices which can receive and manipulate an analog signal. A popular arrangement of such devices includes an A/D converter. The A/D converter may further include a modulator, and specifically an integrator responsive to phases of an analog clock (i.e., $\phi 1$ and $\phi 2$). Digital portion 14 is shown to include sequential elements which are responsive to a clocked transition of a digital master clocking signal (MCLK).

In the example shown, the modulator of analog portion 12 samples the analog input signal (AIN) at periodic time intervals (i.e., time slices). The back-end quantizer may then serve to quantify the magnitude of the analog signal at each of the time slices, and then forwards the quantified value as a digital bit stream to digital portion 14. Thus, the analog portion 12 can be configured as an A/D converter which may be grounded separately from the digital portion using an analog ground signal (AGND) distinguishable from a digital ground signal (DGND). Digital portion 14 may include a DSP and, if necessary, a digital amplifier and transmitter.

In order to periodically sample the analog input signal and dump that sampled value onto the quantizer, the analog clocking signal can be represented as two phases, $\phi 1$ and $\phi 2$. A clocking generator 16 can serve to produce the necessary phases from a crystal input (XTAL). The two phases needed to operate the modulator are well known as non-overlapping analog clocking signal pairs. Depending on the sampling rate, the non-overlapping analog clocking signals can run at a relatively high frequency. According to one example, the analog clocking signals can transition at rates exceeding several MHz. The analog clock phases do not overlap and therefore one phase (e.g., $\phi 1$) is prevented from being at a high voltage value at the same time as the other phase (e.g., $\phi 2$) is at a high voltage value.

According to typical clock generation schemes, the digital clock MCLK is derived from the analog clock by a delay unit 18 which delays transitions of the digital clock relative to the analog clock. A frequency multiplier 20 can frequency multiply the digital clock frequency several times the analog clocking signal frequency if it is necessary to speed up the digital signal operations within digital portion 14. If, for example, the analog clocking signal transitions at 2.048 MHz, the digital portion can transition at rates exceeding 4 MHz and, in some instances, rates exceeding 100 MHz, if needed.

FIG. 2 illustrates a conventional integrator circuit 26 coupled to receive an output from a switched capacitor network 24. The integrator circuit 26 shown is a single-ended implementation. However, it is noted that a differential version is typically used in practice. Switched capacitors 24 selectively sample the analog input signal AIN and reference voltages (not shown) at periodic intervals. The reference voltages may be fed back from a quantizer back-end portion (not shown). This sampling sequence begins by capacitor C1 receiving the analog input signal voltage during a time when analog clocking signal $\phi 1$ is at a high voltage. Capacitor C1 discharges its charge loaded voltage upon integrating capacitor C2 of integrator 26 at a later time in which analog clocking signal $\phi 2$ is at a high voltage. The analog clocking signals $\phi 1$ and $\phi 2$ therefore serve to charge and discharge capacitor C1, and the integrating capacitor performs analog noise-shaping on the voltages discharged (i.e., dumped) onto the integrating capacitor. The output AOUT of integrator 26 is then forwarded onto subsequent integrating stages, or onto the quantizer.

FIG. 3 illustrates a problem which commonly occurs when the analog portion and digital portion are contained on a common monolithic substrate. More specifically, the digital portion generates considerable noise at times when logic gates transition from one logic state to the other. The transitioning logic gates are synchronized with the digital clocking signal MCLK. As shown in FIG. 3, a significant amount of noise is induced upon the substrate adjacent the modulator and, more particularly, induced upon capacitor C1 (FIG. 2) during transitions of the digital clocking signal. A majority of digitally induced noise 30 occurs during the rising edge 32 of the digital clocking signal MCLK. A smaller noise component 34 occurs during the falling edge 36 of the digital clocking signal.

In an effort to separate in time the critical sampling moment from the transitions of the digital clocking signal, a delaying scheme may be used in which the digital clocking signal is delayed an amount $t_D$ from the falling edge of the analog clocking signal. An example of the aforementioned delaying scheme is set forth in U.S. Pat. No. 4,746,899. By delaying the digital clocking signal and particularly the rising edge of the digital clocking signal, noise induced upon the substrate adjacent the switched capacitors is effectively shifted by an amount necessary to allow the noise to settle before the next sampling moment. As shown in FIG. 3, the settling time is shown as $t_S$. Maximizing the settling time will maximize the quiet time which occurs between termination of induced noise and the subsequent sampling moment. Also, maximizing settling time will minimize the amount of residual voltage upon the switched capacitor and therefore will reduce erroneous or spurious incorrect sampling voltages which may eventually get placed upon the integrator and mis-quantified within the quantizer.

Digital noise induced into the analog circuitry occurs primarily through the common substrate in a linear or non-linear fashion. Linear coupling often occurs between the substrate and the bottom plate of the switched capacitor, while non-linear coupling can occur between the substrate and the source/drain of the switch (i.e., transistor). A need therefore exists for moving the digitally induced noise as far away as possible from a time which culminates sampling upon the capacitors (or loading upon the integrator). It would therefore be desirable to implement an analog and digital clocking generator which can maximize the settling time (and thus the quiet time) between the digitally induced noise and the falling edges of the sampling (or loading) analog clock phases. The desired clocking generator must be one which can produce a digital clocking signal within either a synchronous or an asynchronous clocking system. That is, an improved digital clocking system is needed which can reduce noise transmitted to an analog portion from either a synchronous or asynchronous digital portion.

SUMMARY OF THE INVENTION

The problems outlined above are in large part solved by an improved clocking generator hereof. The clocking generator is encompassed upon an integrated circuit which includes both an analog circuit portion and a digital circuit portion. The clocking generator produces an analog clocking signal and a digital clocking signal from a reference clocking input. The reference input is a signal derived from a clocking source external to the integrated circuit (i.e., from an external, crystal oscillator).

The clocking generator produces a rising edge of the digital clocking signal separate and independent from an analog clocking signal. The clocking generator therefore produces the digital clocking signal delayed from a falling edge of the analog clocking signal, wherein the analog clocking signal is thought of as either the first phase or the second phase of the pair of non-overlapping analog clocking signals. The rising edge of the digital clocking signal is delayed from either phase of the non-overlapping analog clocking signals, and is preferably delayed from at least one of the pair of phases by a fractional amount which, according to one embodiment, is approximately ¼ cycle of the digital clocking signal. Using the ¼ cycle delay example, settling time of approximately ¾ cycle of the digital clocking signal can be achieved. It is determined that by delaying the digital clocking signal by ¼ cycle, the present clocking generator is particularly well-suited for use by either a synchronous digital circuit or an asynchronous digital circuit. In the latter instance, the asynchronous digital circuit includes random access memory ("RAM") or read only memory ("ROM").

During use with an asynchronous circuit, the master clock serves to present an address during transitions of the master clock. The address is then decoded. However, the decoded address is not presented upon a word line of the memory element until pre-charge of the memory element is terminated. Accordingly, a logic gate is placed between the decode element and the word line to operate as a second stage address decoding element. The first stage decoding can be achieved by another logic gate whose output is fed to the second stage address decoding logic element. The combination of first and second stages allows pre-addressing to occur approximately one and a half cycles of the digital clocking signal before data is presented from the memory element.

The pre-addressing scheme hereof is useable either in RAM or ROM, and is particularly well suited for mixed-signal integrated circuits. Pre-addressing ensures that the noise generated by the transitioning bit line sensing events has enough time to settle (or dissipate) before the critical analog sampling times (i.e., before the analog clocking signal falling edge). This is achieved by always having the pre-decoded address available from the first stage before pre-charge is terminated so that when pre-charge terminates, the single logic gate within the second stage rapidly transitions the word line which then causes transitions on the bit line. A transitioning bit line will be sensed by a sense amplifier within the memory element to present a data output. The transitioning bit line and sensing operation is therefore considered as an asynchronous noisy operation. Due to the beneficial pre-addressing scheme hereof, bit line transitions and sensing operations are destined to occur well before the critical sampling (or loading) time. According to a preferred embodiment, bit line transitions and sensing operations thereof occur more than ½ cycle of the digital clocking signal before the falling edge of an analog clocking signal. The combination of digital clocking signal delay and the pre-addressing first stage followed by the address decoding second stage allows sufficient quiet time to occur between a pre-existing, noisy bit line transition of an asynchronous system and a following critical sampling or loading time. It is therefore contemplated that the present clocking generator be used either within a synchronous digital circuit and/or an asynchronous digital clocking circuit.

Broadly speaking, the present invention contemplates an integrated circuit. The integrated circuit includes an analog circuit and a digital circuit embodied upon a single substrate.

A clocking generator is coupled to independently and separately produce an analog clocking signal and a digital clocking signal. The rising edge of the digital clocking signal is delayed from a falling edge of the analog clocking signal by a ratio which is preferably near ¼ cycle of the digital clocking signal. Delaying the digital clocking signal by, e.g., ¼ cycle, the present clocking generator is well suited for either asynchronous or synchronous digital circuit operation. Accordingly, the present integrated circuit can include a memory element within the digital circuit portion. The memory element involves a word line and a bit line. The word line is responsive to a digital clocking signal and is addressed at least ½ cycle of the digital clocking signal before the falling edge of the analog clocking signal.

A method for pre-addressing a memory element is also contemplated. The method includes decoding an address destined for a word line of the memory element. The word line is asserted when the address is decoded and when pre-charging a bit line of the memory element is terminated. A falling edge of the analog clocking signal is forwarded to an analog circuit approximately ¼ cycle (preferably more than ¼ cycle) of the analog clocking signal after the word line is asserted.

BRIEF DESCRIPTION OF THE DRAWINGS

Other objects and advantages of the invention will become apparent upon reading the following detailed description and upon reference to the accompanying drawings in which.

Figure 1:
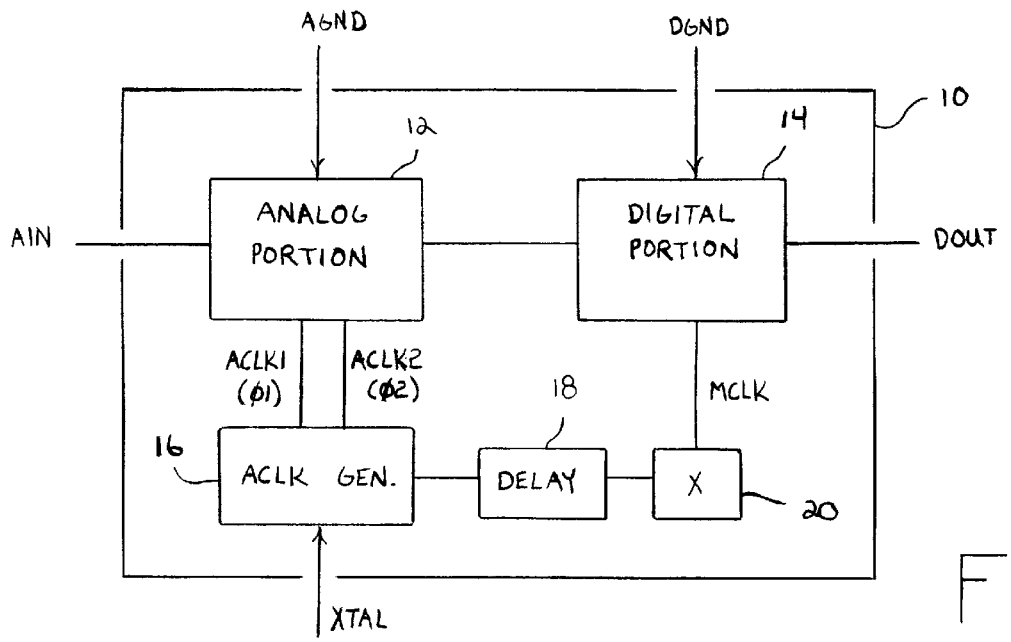
FIG. 1 is block diagram example of a conventional mixed signal integrated circuit embodying an analog portion, a digital portion and an analog clock generator, wherein the analog clock generator produces an analog clocking signal sent to the analog portion and further indirectly produces a digital clocking signal sent to the digital portion.
Figure 2:
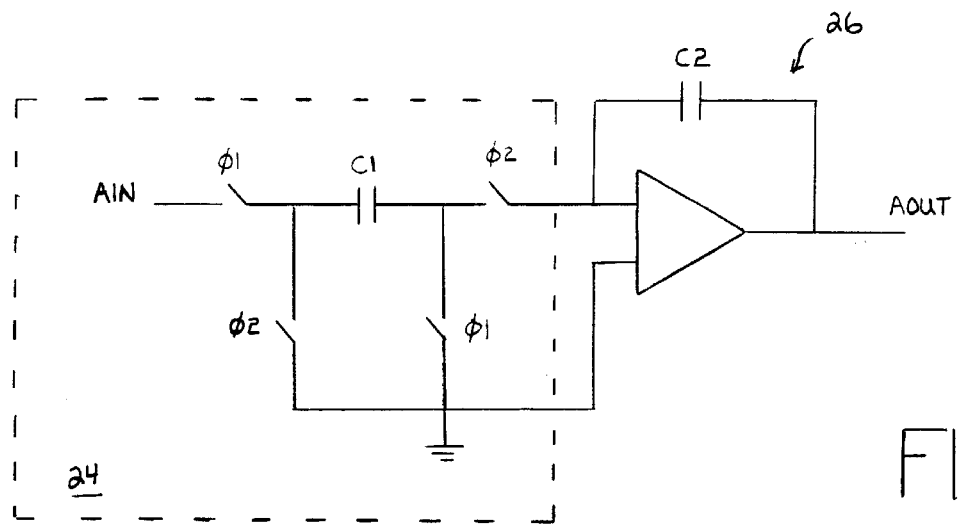
FIG. 2 is a circuit schematic of an exemplary analog circuit coupled as a switched capacitor integrator within the analog portion of FIG. 1.
Figure 3:
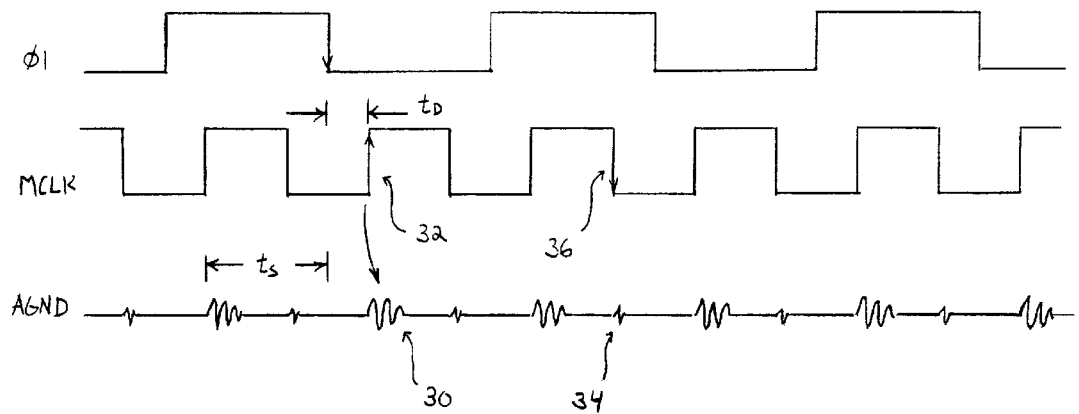
FIG. 3 is a timing diagram of the digital clocking signal derived from the analog clocking signal and delayed from the critical sample time of the analog clocking signal according to a conventional design.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 4:
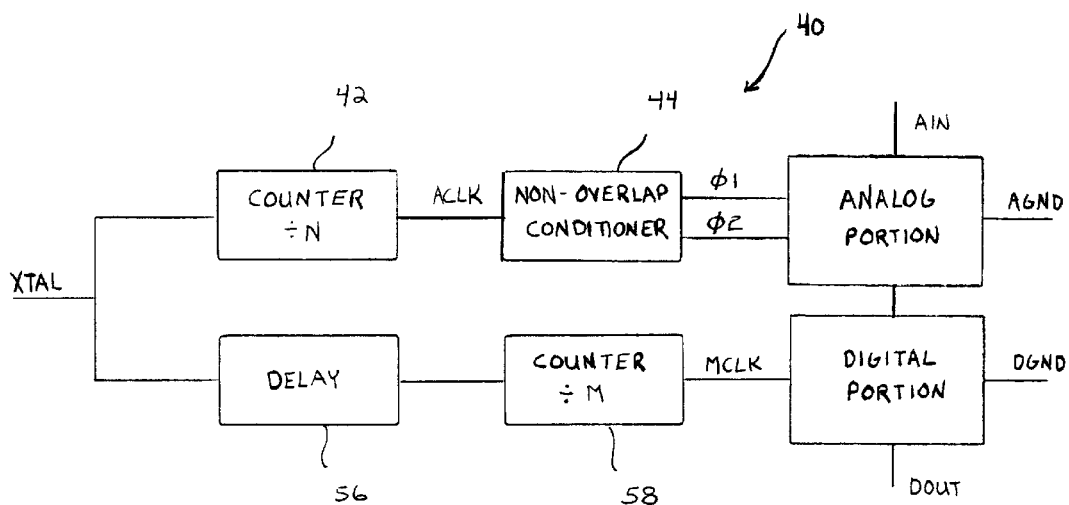
FIG. 4 is a block diagram of the present clocking generator which directly produces both the analog and digital clocking signals from an external crystal clocking source.

Turning to FIG. 4, a clocking signal generator 40 is shown. Generator 40 receives a crystal input XTAL and concurrently produces the analog clocking signal and the digital clocking signal from the crystal input. In particular, the digital clocking signal is not produced directly from the analog clocking signal as in many conventional designs.

According to one embodiment, the analog clocking signal ACLK is produced by a counter 42 which reduces the frequency but maintains the phase of the crystal signal. Frequency reduction is controlled by the counter amount N. Analog clocking signal phases $\phi 1$ and $\phi 2$ are produced from the analog clocking signal ACLK by a non-overlap conditioner 44. One example of a non-overlap conditioner 44 is shown in FIG. 8.

Figure 8:
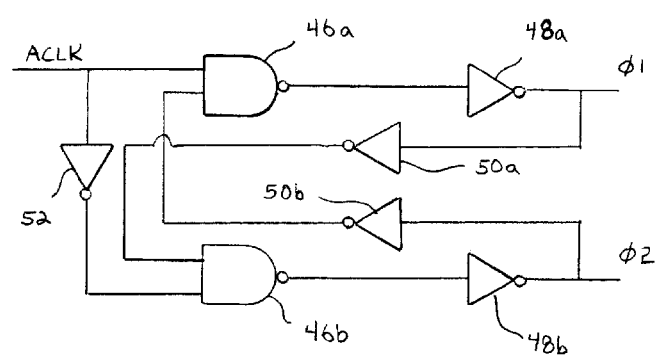
FIG. 8 is a circuit schematic of the non-overlap conditioner shown in FIG. 4, according to one embodiment.

Conditioner 44 shown in FIG. 8 may include a pair of logic gates 46 and a pair of inverters 48 and 50. Inverter 48a produces a respective phase of a respective analog sampling (or loading) clock, whereas the other inverter 50a produces a feedback to the other logic gate 46b. Inverter 52 may be used to reverse the phases presented on the inputs of one logic gate 46b relative to the other logic gate 46a. The example shown of non-overlap conditioner 44 is merely an example. There may be numerous other ways in which to form two phases, wherein one phase logic high state does not overlap with the other phase logic high state.

Referring again to FIG. 4, the digital clocking signal MCLK is used as a master clock for the digitally operated circuit portion. It may be beneficial to use a rising edge as the master clock for master/slave digital storage elements, and the falling edge as the slave clock for the corresponding slave portions. The digital clocking signal may be produced by coupling a delay element 56 either before or after a counter 58. In the embodiment shown, delay element 56 is presented before the counter, and serves to delay transitions of the digital clocking signal from the crystal signal input. According to one example, the amount of delay induced by element 56 may be ½ cycle of the crystal clocking input. Counter 58 may have a count factor M which reduces the cycle or period of the digital clocking signal from that of the analog clocking signal so that the digital clocking signal has a higher frequency, if desired. Delay element 56 can be realized by coupling, for example, a pair of inverters in series or through use of synchronous storage elements (i.e., flip flops).

Figure 5:
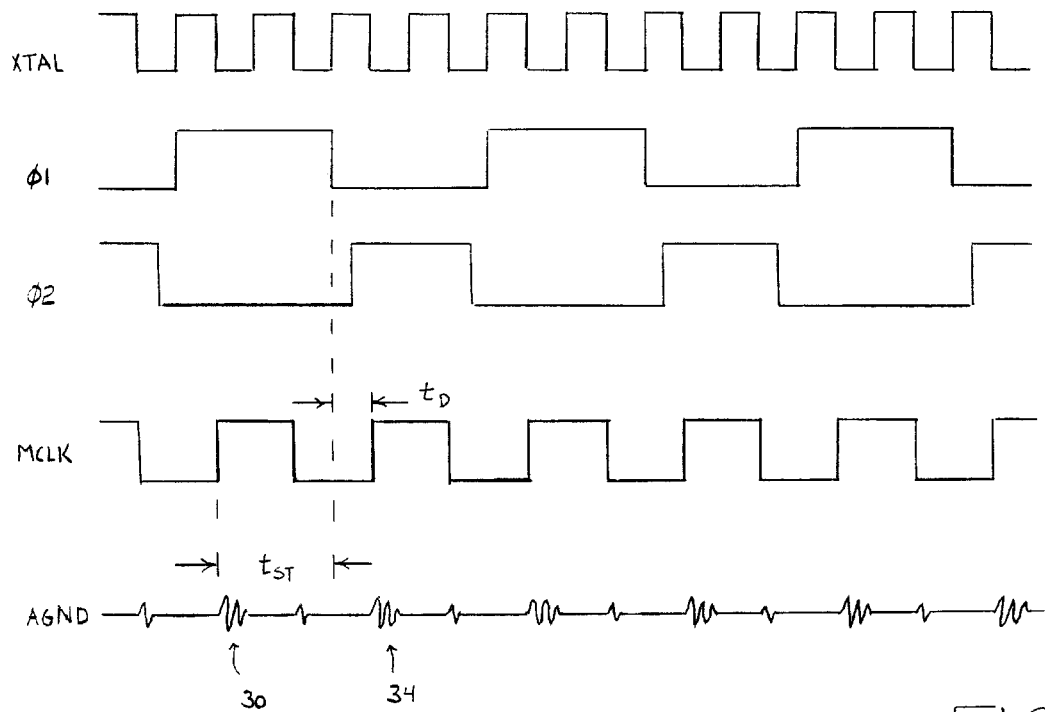
FIG. 5 is a timing diagram of the digital clocking signal and the analog clocking signal derived from the block diagram of FIG. 4 and useable within a synchronous clocking system, wherein the critical sampling and dumping times of the analog clocking signal occur before the next digital clocking cycle and only after a sufficient quiet time has elapsed from the previous digital clocking cycle.

FIG. 5 illustrates a timing diagram achieved by clocking generator 40 (FIG. 4) and the occurrence of digitally induced noise relative to critical analog sampling or loading events. The digital clocking signal MCLK is delayed an amount $t_D$ from the analog clocking signal (either $\phi 1$ or $\phi 2$). The rising edges of the digital clocking signal induces a greater amount of noise upon the analog substrate areas, as shown by reference numeral 30. However, by delaying the rising edge of the digital clock from the falling edge of $\phi 1$ or $\phi 2$, yet maintaining synchronization with the analog clock phases, noise induced by the digital clock rising edges occurs well before the analog sampling clock φ1, and well before the analog loading clock φ2.

Figure 6:
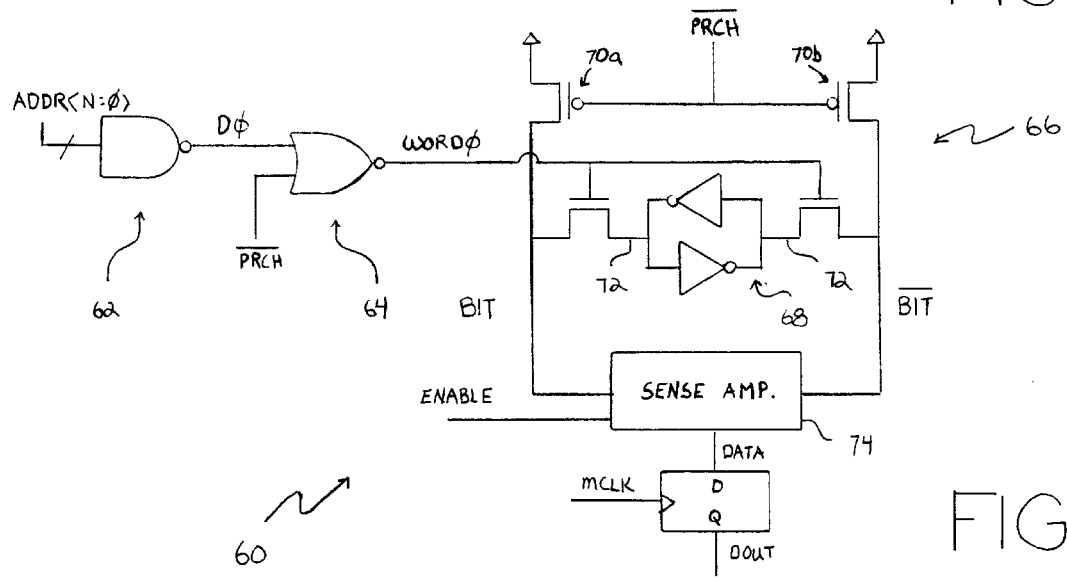
FIG. 6 is a circuit schematic of an asynchronous clocking system employing a memory element pre-addressed more than one digital clocking cycle before data is made available from the sense amplifier.

Referring to FIGS. 4 and 5, the amount of settling time is at least approximately 1(½(N/M)), where M is the count factor of counter 58 and N is the count factor of counter 42. If N=2 and M=1, then the amount of settling time becomes 1(¼), or ¾ cycle of the digital clocking signal. Thus, the critical sampling and loading times occur relatively close to, but always before, the next noise instance 34. The timing diagram of FIG. 5 is readily applicable to synchronous circuits, whereby transitions of logic gates are synchronized with the digital clocking signal. Application is needed for digital circuits with asynchronous operations, such as the circuit shown in FIG. 6. Circuit 60 includes a pair of addressing stages 62 and 64, and a memory element 66. Memory element 66 is shown as a single RAM cell having a single bit line, a complimentary bit line, and a single word line. It is to be recognized that memory element 66 can be arranged across an array of memory elements to form an overall RAM circuit. The static storage elements 68 within memory element 66 can achieve static RAM (or SRAM) function. It is also recognized that the static elements can be programmably formed or etched to achieve a ROM memory element, if desired.

The bit line (and complimentary bit line) are pre-charged at times when they are not being written to or read from. Pre-charging involves placing a logic low value from a pre-charge signal onto transistors 70a and 70b. Upon receiving the logic low values, p-channel transistors 70 couple the corresponding bit lines to a power supply voltage (e.g., 5.0 volts or 3.3 volts). As shown, pre-charging the bit lines occurs whenever the stored voltages at nodes 72 are not being accessed by a logic high value on WORD0. A sense amplifier 74 senses differences in the bit line and the complimentary bit line whenever a read operation occurs via a logic high value on WORD0. Accordingly, sense amplifier 74 may involve a latched differential amplifier which produces a logic high value on the data output if, for example, the voltage on the bit line sensed is higher than the voltage on the complimentary bit line sensed.

Timing of the sensing operation is achieved by addressing the corresponding word line and then enabling the sense amplifier. Addressing hereof occurs in two stages. For memories with a large number of addresses ADDR, where N is sufficiently large, it may take a substantial amount of time and/or complicated control logic signals to decode all the address bits within a single stage. Due to the speed requirements imposed by stage 64, a pre-decoding scheme of stage 62 is needed. The first stage 62 preferably uses a relatively slow logic gate (i.e., NAND gate) to decode all or most of the address bits during the time when the digital clocking signal is low. There may be instances where many NAND gates change state during any particular clock cycle (one row or word line will be selected and another row or word line will be de-selected) since not all address bit change at exactly the same time. However, the NAND gates are formed so that they transition relatively slow so that the noise arising from the NAND gates is spread out in time. Peak noise is therefore disseminated over at least a portion of the digital clocking signal during the pre-decoded time. Accordingly, the amount of noise generated by the first stage 62 pre-decoding is minimum. The second state 64 of address decoding enables the word line corresponding to the pre-decoded address bit. The word line is enabled as soon as the pre-charging of bit lines (i.e., PRCH bar) is disabled. Second stage 64 is relatively fast, whereby the word line is quickly presented once pre-charge is disabled. According to one example, the least significant bit of the address bits may be decoded in the second stage if page mode addressing is used. Thus, depending on the speed requirements of the particular memory design, more (or less) address bits could be decoded in the second stage beyond the two inputs D0 and pre-charge. The second stage 64 therefore generates a minimum amount of substrate noise when it changes state since it decodes with only the precharge so that only the single selected word line will transition during its decode.

Figure 7:
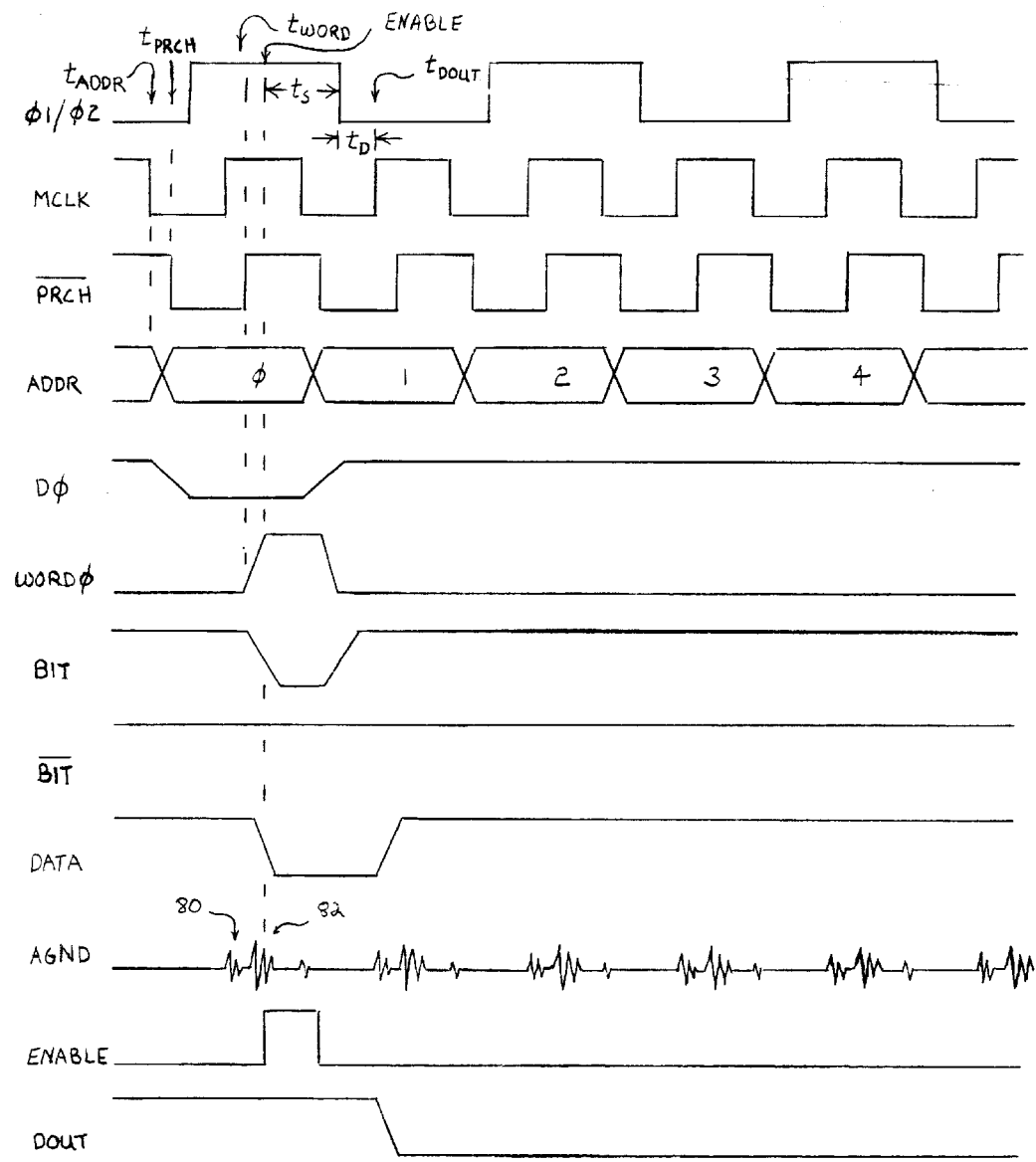
FIG. 7 is a timing diagram of the circuit schematic shown in FIG. 6, wherein pre-addressing the memory element causes the critical sampling and dumping times of the analog clocking signal to occur only after a sufficient quiet time has elapsed from the previous transitioning of the bit lines (or operation of the sense amplifiers) and before the next transitioning of the bit lines (or operation of the sense amplifiers)

As will be shown in FIG. 7, the main culprit of noise induced by decoding and accessing a memory element occurs primarily from bit line transitions and sensing, and not by the present, two stage pre-decoding scheme. This bit line induced noise is deemed asynchronous noise which must be produced well before the critical analog sampling times in order to allow a sufficient interim quiet time.

Referring to FIG. 7, a timing diagram of signals within the asynchronous digital circuit 66 (FIG. 6) is shown. An analog clocking signal ACLK is generically shown to represent either the first analog clocking signal phase or the second analog clocking signal phase. Regardless of which phase is used, the falling edge of the analog clocking signal represents a critical time for either sampling the incoming signal or loading a sampled analog signal onto an integrating capacitor. The rising edge of the digital clocking signal is shown delayed by an amount $t_D$ from the falling edge of the analog clocking signal. Preferably $t_D$ is 1/(2(N/M)) wavelength of the digital clocking signal. Values for M and N are selected so that $t_D$ is as small as possible so that the settling time $t_S$ is maximized. Obviously, $t_D$ is depending on the speed of MCLK as to what would be a desirable fraction of the digital clocking signal. MCLK can also be synchronized to any clock (external or internal the integrated circuit) provided the clock is not the analog clocking signal. The clock from which MCLK is synchronized can, for example, be one that is more closely synchronized to transitions of the analog clocking signal. If N=2 and M=1, then $t_D$ becomes ¼ wavelength of the digital clocking signal. The pre-charge signal, PRCH bar, is synchronized with the digital clocking signal to pre-charge the bit lines when the digital clocking signal is at a logic low level. Also synchronized with the falling edge of the digital clocking signal are addresses forwarded to the pre-decoding logic unit. Decoding occurs slightly after the addresses are presented, as shown by output from the pre-decoding unit, labeled D0. The word line, WORD0, does not transition when addressed until pre-charging is terminated (i.e., upon the rising edge of the pre-charge signal). Once the word line is addressed, the corresponding bit line (or the complementary bit line) will transition based on the pre-existing voltage stored within the memory cell. In the example shown, the bit line transitions from a pre-charge state and the complimentary bit line maintains its pre-charge value. The sense amplifier can therefore sense the change in voltages upon the corresponding bit lines when the enable signal goes high. The transitioning bit lines and sensing operation involves a substantial amount of noise induced upon the substrate adjacent the analog circuit. This is due to the large capacitance associated with the bit line. Also, the sense amplifiers typically make a sensing decision quickly by examining a relatively small voltage difference between the bit line and complementary bit line. The sense amplifier therefore quickly induces a substantial amount of gain to the memory circuit. Fast amplification causes substantial transient currents, and therefore noise, upon the substrate. The substrate should remain at ground, but due to noise imputed by the transitioning bit lines and the sense amplifier, rather high fluctuations are shown at times when the word line transitions 80 and especially when the difference in bit line values is sensed by the sense amplifier at time 82.

FIG. 7 illustrates a time in which the zero address occurs, and is denoted as $t_{ADDR}$. Pre-charge $t_{PRCH}$ is generated from MCLK, and therefore is delayed relative to MCLK. Pre-charge must become active before the addresses transition to prevent word line glitches which increase noise and could result in data-overwriting errors during a write transaction. Once pre-charge is terminated, the word line is quickly addressed at time $t_{WORD}$. Soon after the word line is addressed, the voltages stored within the memory element are presented to the corresponding bit lines causing not only the bit lines to transition, but the logic responsive to the bit lines to also transition at time $T_{ENABLE}$. This means transitory current (and voltage) paths are created between the power supply and the ground supply. Thus, the sense amplifier becomes noisy at moment 82. That amount of noise is rather substantial compared to other times in which noise is induced. However, the analog clocking signal falling edge occurs at a settling time $t_S$ after the asynchronous noise 82. That amount of settling time is shown to be a function of M and N (FIG. 4), and can be approximately one-half the digital clocking cycle or, depending on the duty cycle of the analog clocking signal, one-quarter cycle of the analog clocking signal. The data arising from address 0 does not appear until time $t_{DOUT}$. Time $t_{DOUT}$ is delayed approximately one and a half cycles of the digital clocking signal after the address appears at time $t_{ADDR}$. Thus, memory cell is deemed to be pre-addressed to relax the timing requirements on the memory design while ensuring a significant settling time occurs before the next critical analog sampling (or loading) moment.

It will be appreciated by those skilled in the art having the benefit of this disclosure that the present integrated circuit, clock generator, and method hereof is believed to be capable of applications with any integrated circuit having both analog and digital portions. Furthermore, it is also to be understood that the embodiments shown and described are to be taken as presently preferred embodiments. Various modifications and changes may be made to the sampling (or loading) technique, as well as to the asynchronous digital portion, all of which would be obvious to a person skilled in the art having the benefit of this disclosure. It is therefore intended that the following claims be interpreted to embrace all such modifications and changes, and accordingly, the specifications and drawings are to be regarded in an illustrative rather than a restrictive sense.

What is claimed is:

1. An integrated circuit, comprising:
   an analog circuit and a digital circuit embodied within the integrated circuit; and
   a clocking generator coupled to produce an analog clocking signal and a digital clocking signal, wherein a rising edge of the digital clocking signal is delayed from a falling edge of the analog clocking signal approximately one quarter cycle of the digital clocking signal.

2. The integrated circuit as recited in claim 1, wherein the analog circuit comprises an integrator coupled to sample an analog signal during the falling edge of the analog clocking signal.

3. The integrated circuit as recited in claim 1, wherein the analog circuit comprises an integrator coupled to forward a sampled analog signal to a summing node of the integrator during the falling edge of the analog clocking signal.

4. The integrated circuit as recited in claim 1, wherein the analog circuit comprises a sequence of switches coupled to sample an analog signal during a falling edge of the analog clocking signal, or to forward a sampled analog signal to a summing node during the falling edge of the analog clocking signal.

5. The integrated circuit as recited in claim 1, wherein the digital circuit comprises sequential logic which transitions during the rising edge of the digital clocking signal.

6. The integrated circuit as recited in claim 5, wherein the sequential logic causes a change in logic state output in response to the rising edge of the digital clocking signal.

7. The integrated circuit as recited in claim 1, wherein the falling edge of the analog clocking signal occurs approximately three quarters cycle of the digital clocking signal after an immediately preceding rising edge of the digital clocking signal.

8. The integrated circuit as recited in claim 1, wherein the digital circuit comprises a memory element and a bit line of the memory element, said bit line is adapted to transition between logic states greater than one half cycle of the digital clocking signal before the falling edge of the analog clocking signal.

9. The integrated circuit as recited in claim 8, wherein the digital circuit comprises a sense amplifier coupled to sense the bit line transitions and forward an amplified magnitude of the transitioning bit line more than one half cycle of the digital clocking signal before the falling edge of the analog clocking signal.

10. The integrated circuit as recited in claim 8, wherein the digital circuit comprises a sense amplifier coupled to sense the bit line transitions and forward an amplified magnitude of the transitioning bit line at least one half cycle of the digital clocking signal before the falling edge of the analog clocking signal.

11. The integrated circuit as recited in claim 8, wherein the clocking generator produces the analog clocking signal and the digital clocking signal independent from one another and from a clocking source external to the integrated circuit.

12. An integrated circuit, comprising:
    an analog circuit operably coupled to sample an analog signal forwarded to the analog circuit during a falling edge of an analog clocking signal; and
    a memory element having a word line and a bit line, wherein the word line is responsive to a digital clocking signal and is addressed more than one half cycle of the digital clocking signal before the falling edge of the analog clocking signal.

13. The integrated circuit as recited in claim 12, further comprising a pre-charging transistor coupled between the bit line and a power supply for connecting the bit line to the power supply during times when a pre-charge signal is asserted and forwarded to the pre-charging transistor.

14. The integrated circuit as recited in claim 13, wherein the memory element further comprises:
    a decoder coupled to receive a plurality of addressing bits; and
    a logic gate coupled to the decoder for addressing the word line during times when the decoded address is sent from the decoder and the pre-charge signal is deasserted.

15. The integrated circuit as recited in claim 14, wherein the logic gate is a NOR gate having at least two input conductors adapted to receive the decoded address and the pre-charge signal.

16. The integrated circuit as recited in claim 15, further comprising a sense amplifier coupled to sense a transition of the bit line and output data therefrom more than one third cycle of the digital clocking signal before the falling edge of the analog signal.

17. The integrated circuit as recited in claim 16, wherein the output data output from the sense amplifier occurs at least one half cycle of the digital clocking signal after the time when the decoded address is sent from the decoder.

18. A method for pre-addressing a memory element, comprising:

decoding an address destined for a word line of the memory element;

asserting the word line when the address is decoded and when pre-charging a bit line of the memory element is terminated; and forwarding a falling edge of an analog clocking signal to an analog circuit more than one quarter cycle of the analog clocking signal after said asserting step.

19. The method as recited in claim 18, wherein said asserting comprises transitioning a voltage value upon the word line when the decoded address occurs in conjunction with terminating said pre-charging.

20. The method as recited in claim 18, wherein said decoding comprises changing said address during transition of a digital clocking signal, and wherein the falling edge of the analog clocking signal follows more than one cycle of the digital clocking signal after said changing.

21. The method as recited in claim 18, wherein said forwarding comprises switching a voltage of an analog signal onto a capacitor within the analog circuit during the falling edge of the analog clocking signal.

22. The method as recited in claim 18, wherein said forwarding comprises switching a voltage stored upon a capacitor to an integrator within the analog circuit during the falling edge of the analog clocking signal.

* * * * *